United States Patent
Hisamitsu et al.

(10) Patent No.: US 10,704,143 B1
(45) Date of Patent: Jul. 7, 2020

(54) OXIDE FILM FORMING METHOD

(71) Applicant: ASM IP Holding B.V., Almere (NL)

(72) Inventors: Takafumi Hisamitsu, Sagamihara (JP); Seiji Okura, Sagamihara (JP)

(73) Assignee: ASM IP Holding B.V., Almere (NL)

(*) Notice: Subject to any disclaimer, the term of this patent is extended or adjusted under 35 U.S.C. 154(b) by 0 days.

(21) Appl. No.: 16/257,185

(22) Filed: Jan. 25, 2019

(51) Int. Cl.
*C23C 16/455* (2006.01)
*C23C 16/40* (2006.01)

(52) U.S. Cl.
CPC ...... *C23C 16/45553* (2013.01); *C23C 16/401* (2013.01); *C23C 16/405* (2013.01); *C23C 16/407* (2013.01); *C23C 16/45542* (2013.01)

(58) Field of Classification Search
None
See application file for complete search history.

(56) References Cited

U.S. PATENT DOCUMENTS

| | | | |
|---|---|---|---|
| 7,411,161 B2 * | 8/2008 | Kim | F27D 1/045 118/724 |
| 8,465,811 B2 | 6/2013 | Ueda | |
| 9,076,646 B2 * | 7/2015 | Sims | H01L 21/02167 |
| 9,284,642 B2 | 3/2016 | Nakano et al. | |
| 2002/0142585 A1 * | 10/2002 | Mandal | C23C 16/401 438/633 |
| 2012/0077349 A1 * | 3/2012 | Li | C23C 16/45542 438/762 |
| 2014/0141542 A1 * | 5/2014 | Kang | C23C 16/345 438/14 |

* cited by examiner

*Primary Examiner* — Jose I Hernandez-Kenney
(74) *Attorney, Agent, or Firm* — Studebaker & Brackett PC

(57) ABSTRACT

Examples of a oxide film forming method include providing a precursor to a reaction space including a substrate and a susceptor, and forming an oxide film on the substrate by introducing at least one of $C_xO_y$ and $N_xO_y$ (x and y are integers) as a reactant gas into the reaction space while applying a pulse RF power having a duty cycle less than 60% to an RF plate to generate plasma of the reactant gas, the RF plate being provided in the reaction space so as to face the susceptor, wherein the providing and the forming are repeated a predetermined number of times.

6 Claims, 3 Drawing Sheets

OXIDE FILM FORMING METHOD

TECHNICAL FIELD

Examples are described which relate to an oxide film forming method.

BACKGROUND

PEALD (Plasma-Enhanced Atomic Layer Deposition) causes a precursor to adsorb to a substrate, for example, and subsequently generates oxygen plasma, thereby forming an oxide film on the substrate. For example, the substrate includes a certain thin film or a pattern as a covered object on a surface, and an oxide film can be formed on the covered object through PEALD. The covered object is called an underlying film because this film serves as an underlayer for the oxide film. The oxygen plasma can be generated by providing oxygen gas for a reaction space including an RF plate and by applying a high-frequency power to the RF plate.

Depending on a type of the underlying film or an oxidation source, the underlying film may be damaged as the oxide film is formed through PEALD. Such damage may sometimes thin the underlying film.

SUMMARY

Some examples described herein may address the above-described problems. Some examples described herein may provide an oxide film forming method that can reduce the adverse effect on the substrate.

In some examples, an oxide film forming method includes providing a precursor to a reaction space including a substrate and a susceptor, and forming an oxide film on the substrate by introducing at least one of CxOy and NxOy (x and y are integers) as a reactant gas into the reaction space while applying a pulse RF power having a duty cycle less than 60% to an RF plate to generate plasma of the reactant gas, the RF plate being provided in the reaction space so as to face the susceptor, wherein the providing and the forming are repeated a predetermined number of times.

DETAILED DESCRIPTION

The oxide film forming method is described with reference to the drawings. The same or corresponding configuration elements are assigned the same symbols, and the redundant description may be omitted in some cases.

Figure 1:
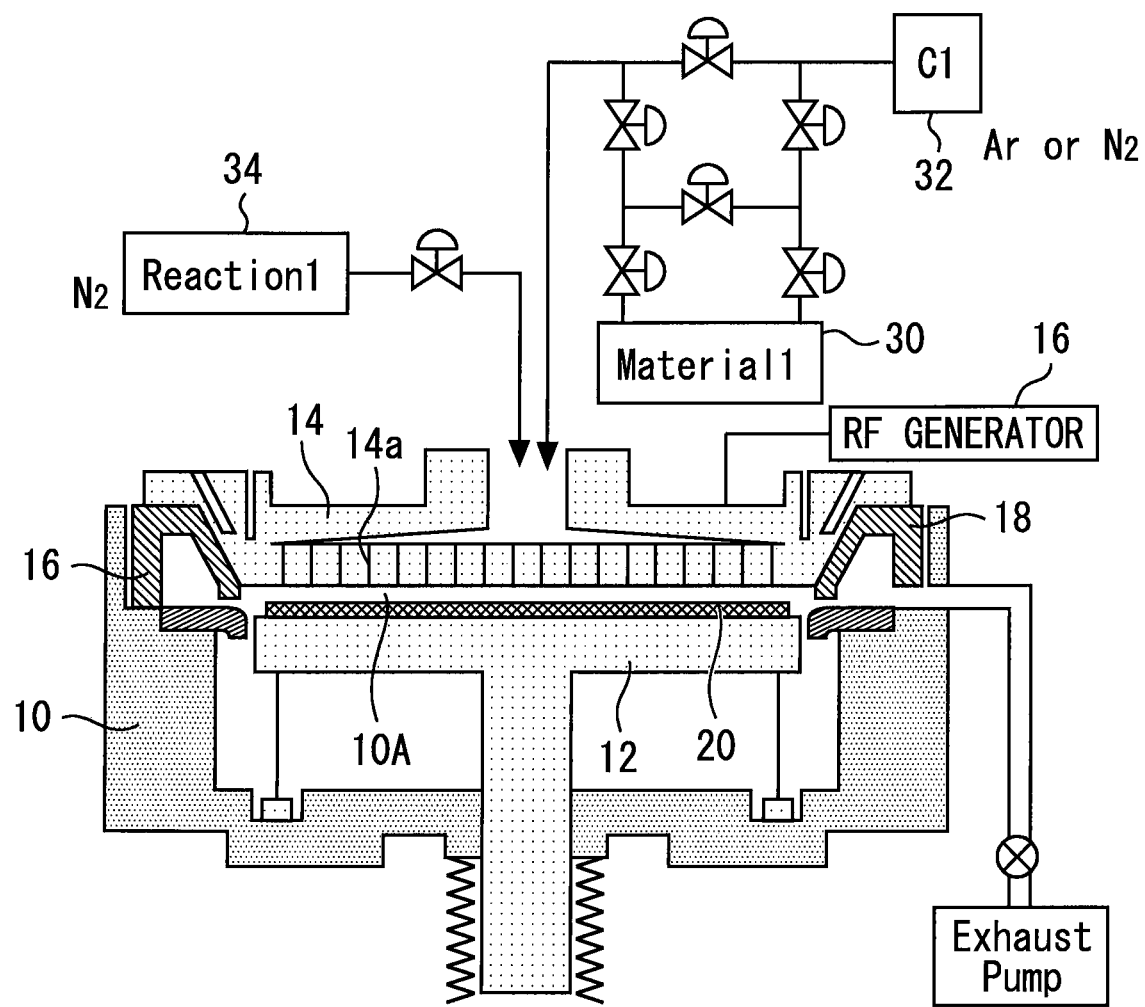
FIG. 1 illustrates a configuration example of a film-forming apparatus.

FIG. 1 illustrates a configuration example of a film-forming apparatus. A susceptor 12 and an RF plate 14 are provided in a chamber 10. A parallel plate structure where the susceptor 12 and the RF plate 14 face each other provides a reaction space 10A in the chamber 10.

The susceptor 12 supports a substrate 20. The substrate 20 serves as an object on which an oxide film is to be formed. The substrate 20 has a material containing carbon as an underlying film, for example. The underlying film is photoresist, for example. The susceptor 12 may be a grounded electrode. For example, the susceptor 12 is heated or cooled to control the temperature of the substrate 20.

The RF plate 14 is connected to a power source 16. The power source 16 applies HRF power of 13.56 or 27 MHz, for example, to the RF plate 14. The power source 16 also applies LRF power of 5 MHz or 400 to 500 kHz, for example, to the RF plate 14 as required. Application of the RF power to the RF plate 14 generates plasma in the reaction space 10A, specifically between the susceptor 12 and the RF plate 14.

The power source 16 applies pulse RF power to the RF plate 14. For example, the power source 16 does not continuously oscillate but pulse-oscillates instead. The power source 16 can apply duty-controlled pulse RF power to the RF plate 14.

The RF plate 14 also functions as a shower plate. A gas is supplied into the reaction space 10A from above the RF plate 14 through a through-hole 14a of the RF plate 14. For example, a precursor 30 in a liquid state, a carrier gas source 32, and a reactant gas source 34 can be provided. The precursor 30 is preserved in the liquid state, and can supply its vapor by being heated. A tube that introduces the precursor 30 into the chamber 10 is provided with valves. By opening a valve, the vapor of the precursor 30 can be provided together with the gas of the carrier gas source 32 for the reaction space 10A. By opening another valve, the reactant gas of the reactant gas source 34 can be provided for the reaction space 10A. Valve opening and closing processes control whether to provide the gas for the reaction space 10A or not.

An exhaust duct 18 can be formed to surround the susceptor 12. The gas having been supplied to the reaction space 10A radiates in a plan view, enters the exhaust duct 18, and is exhausted to the outside of the chamber 10. In a case where the apparatus described above is used, a controller that achieves the following method can be provided.

Figure 2:
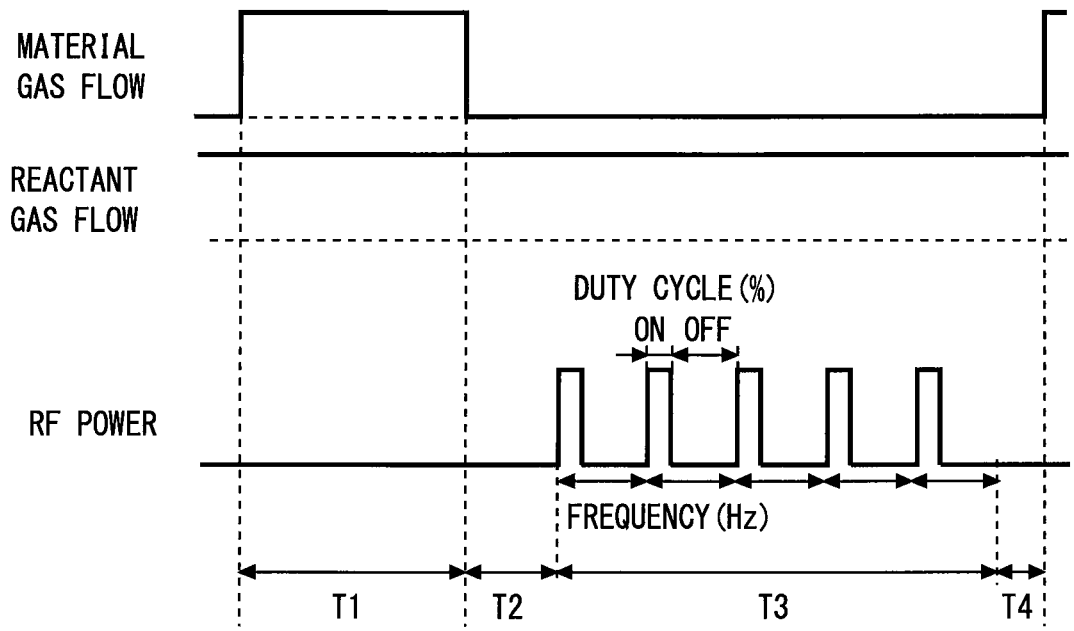
FIG. 2 is a timing chart illustrating an oxide film forming method.

FIG. 2 is a timing chart illustrating an oxide film forming method. According to one example, the oxide film forming method includes (A) precursor providing, (B) source purging, (C) RF application, and (D) post purge, in this order. The A to D processes serve as one film forming process. Repetition of the process forms an oxide film having a desired thickness.

In this disclosure, the "oxide film" may refer to a film characterized by M-O bonds (M is a metal or silicon), constituted mainly or predominantly by M-O bonds, categorized in M-O films, and/or having a main skeleton substantially constituted by M-O bonds. When a precursor having hydrocarbons such as organoaminosilane is used, the oxide film may contain carbons derived from the precursor. In some examples, the oxide film may contain C, H, and/or N as a minor element.

(A) Precursor Providing

In a time period T1 in FIG. 2, the substrate is supplied with the precursor. The valve is opened to supply the reaction space 10A with the vapor of the precursor 30 together with the carrier gas.

As the precursor, silane compounds such as monosilane are excluded since they are reactive to oxygen even without a plasma. In some examples, the precursor is non-reactive to oxygen, CxOy, and NxOy, and the term "non-reactive" refers to detecting no film volume or particles generated on a substrate as a result of reaction under conditions where the precursor and oxygen, CxOy, or NxOy are introduced simultaneously to a reaction space in an atmosphere having a temperature of 400° C. or less and a pressure of 10 torr or less in the absence of plasma. In some examples, the precursor contains Si, Ti, or Ge, and the oxide film is constituted substantially by SiO, TiO, or GeO. In other examples, the precursor contains As, Ga, Sb, In, Al, or Zr. A skilled artisan can select a suitable precursor depending on the type of oxide film through routine experiment based on this disclosure.

For example, for SiO film, organoaminosilanes can be used, including bis(diethylamino)silane (BDEAS or SAM24), tetrakis(dimethylamino)silane (4DMAS), tris(dimethylamino)silane (3DMAS), bis(dimethylamino)silane (2DMAS), tetrakis(ethylmethylamino)silane (4EMAS), tris(ethylmethylamino)silane (3EMAS), bis(tertiary-butylamino)silane (BTBAS), and bis(ethylmethylamino)silane (BEMAS), singly or in any combination of two or more. For example, for AsO film, triethoxyarsine and triethylarsenate, singly or in any combination, can be used. For example, for SbO film, $Sb(i-O-C_3H_7)_3$ and antimony tri-ethoxide, singly or in any combination, can be used. For example, for InO film, $(CH_3)_3In$ and $(C_2H_5)_3In$, singly or in any combination, can be used. For example, for GaO film, $Ga(OCH_3)_3$, and $Ga(OC_2H_5)_3$, singly or in any combination of two or more, can be used. For example, for TiO film, titanium isopropoxide or titanium tetraisopropoxide (TTiP), tetrakis(dimethylamino) titanium (TDMAT), tetrakis(1-methoxy-2-methyl-2-propanolate)titanium (Ti(MMP)4), titanium-tetra-butoxide (TTB), and tetrakis(ethylmethylamino)titanium (TEMAT), singly or in any combination of two or more, can be used. For example, for GeO film, tetraethyloxygermane (TEOG), tetramethyloxygermane (TMOG), tetraethylgermane (TEG), tetramethylgermane (TMG), tetrakis(dimethylamino)germanium (TDMAGe), germanium tetraisopropoxide, and germanium tetraisobutoxide, singly or in any combination of two or more, can be used. In some examples, the precursor consists essentially of any of the foregoing compounds. The term "consisting essentially of" is used to the full extent permitted by law and regulation.

As described above, the precursor can include Si, Ti or Ge. In the time period T1, the precursor can adsorb to the underlying film of the substrate 20.

(B) Source Purging

In a time period T2 in FIG. 2, the precursor without adsorbing to the substrate 20 remaining in the reaction space 10A is purged. This purge can be achieved by continuously supplying the reactant gas to the reaction space 10A.

(C) RF Application

In a time period T3 in FIG. 2, the reactant gas is introduced into the reaction space 10A while pulse RF power having a duty cycle less than 60% is applied to the RF plate 14. In an "ON" time period, the RF power is applied to the RF plate 14. In an "OFF" time period, the RF power is not applied to the RF plate 14. The "ON" time period and the "OFF" time period are adjusted to make the duty cycle (duty ratio) less than 60%. According to another example, the duty cycle of the pulse RF power can be equal to or less than 50%. According to still another example, the duty cycle of the pulse RF power can be more than 0% and equal to or less than 15%. Application of the pulse RF power to the RF plate 14 can generate the plasma of the reactant gas and form an oxide film on the substrate 20.

At least one of CxOy and NxOy (x and y are integers) can be used as the reactant gas. In some examples, the reactant gas is at least one of $CO_2$ and $N_2O$, for example.

In some examples, the plasma is generated using CxOy and/or NxOy with or without a rare gas. As CxOy, CO, $C_2O$, $CO_2$, $C_3O_2$, $CO_3$, and $C_5O_2$ can be used singly or in any combination of two or more. As NxOy, NO, $N_2O$, $NO_2$, $N_2O_3$, $N_2O_4$, and $N_2O_5$ can be used singly or in any combination of two or more. In some examples, the plasma of CxOy and/or NxOy is a $CO_2$ plasma. In some examples, in step (C), an oxygen plasma is further added to the reaction space except for the beginning of step (C), where a plasma of CxOy and/or NxOy does not provide sufficient oxidizability so that an oxide film with desired properties is not obtained, or where a plasma of CxOy and/or NxOy increases concentration of impurities in an oxide film. In the beginning of step (C), a plasma of CxOy and/or NxOy may be used without an oxygen plasma so as to inhibit oxidation of an underlying layer, and after an oxide film is formed on an interface surface of the underlying layer and becomes thick enough (e.g., a thickness of about 0.5 nm to about 2.0 nm, depending on the RF power) for alleviating the oxidation problem (where the oxide film itself functions as a barrier layer blocking oxidation of the underlying layer), an oxygen plasma is added to or partially or completely replaces the plasma of CxOy and/or NxOy. In some examples, the oxide film is composed of a lower oxide layer formed using a plasma of CxOy and/or NxOy without a plasma of oxygen, and an upper oxide layer formed using a mixed plasma of oxygen and CxOy and/or NxOy (wherein a flow ratio of oxygen to CxOy and/or NxOy may be in a range of more than 0/100 to about 100/0). In some examples, in step (C), no oxygen plasma is used in the reaction space throughout step (C).

As described above, when the oxide film is formed, in addition to the plasma of the reactant gas, oxygen plasma may be generated. In this example, the reactant gas and the oxygen gas are provided for the reaction space 10A while the pulse RF power is applied to the RF plate 14. According to another example, when the oxide film is formed, the oxide gas is not provided for the reaction space 10A, and the plasma of a reactant gas that is of at least one of CxOy and NxOy (x and y are integers) is generated. Elimination or reduction in density of the oxygen plasma can reduce the damage to the underlying film of the substrate 20. Specifically, in a case where the underlying film contains carbon, the effect of reducing the damage is high.

Figure 3:
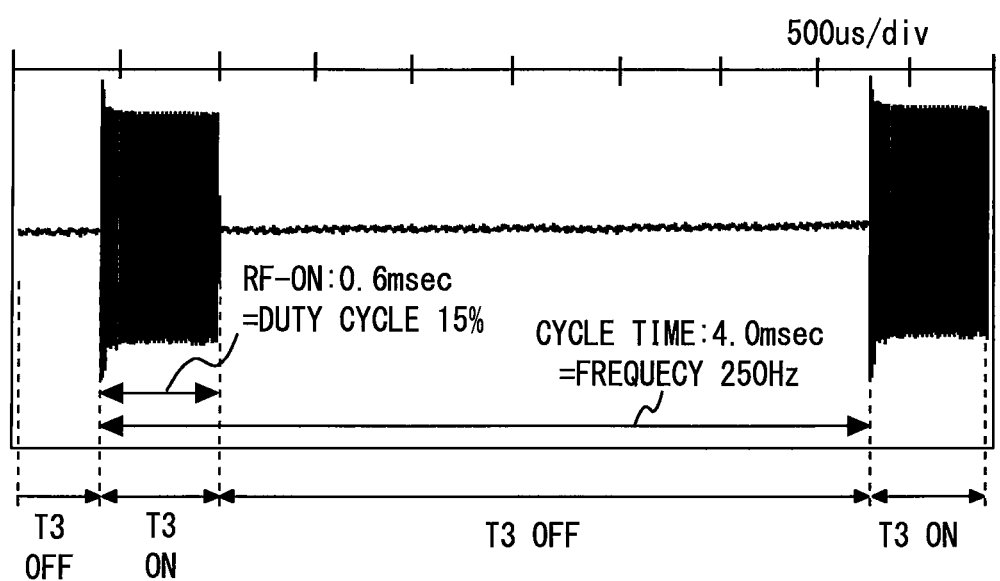
FIG. 3 illustrates an example of the spectrum of the pulse RF power.

The time period T3 may be 100 to 1000 milliseconds, for example. The frequency of the pulse RF power may range from 10 to 100,000 Hz. According to another example, the frequency of the pulse RF power is equal to or more than 500 Hz. FIG. 3 illustrates an example of the spectrum of the pulse RF power. FIG. 3 illustrates a waveform obtained by a spectrum analyzer. The cycle time is 4 milliseconds. In the time period of 4 milliseconds, RFON occurs only one time. That is, in the $T3_{ON}$ time period, the pulse RF power is applied to the RF plate. In the $T3_{OFF}$ time period, the pulse RF power is not applied to the RF plate. In this example, the sum of the $T3_{ON}$ time period and the $T3_{OFF}$ time period is 4 milliseconds. The frequency of the pulse RF power at this time is 250 Hz. In this example, the duty cycle of the pulse RF power is 15%.

(D) Post Purge

In the time period T4 in FIG. 2, the gas in the reaction space 10A is purged. The purge from the reaction space 10A may be achieved by providing the reaction space with the reactant gas, for example.

A predetermined number of times of repetition of the processes A to D described above forms the oxide film on the substrate. The formed oxide film may include SiO, TiO or GeO, for example. The film thickness of the oxide film may be equal to or less than 4 nm, for example.

In the above example, the reaction space is supplied with the reactant gas entirely through the precursor providing, the source purging that is the precursor purging, the oxide film forming by application of RF, and the post purge that is the reaction space purging. However, the reactant gas may be provided for the reaction space only during the RF application. During the other time periods, the carrier gas may be provided for the reaction space.

Figure 4:
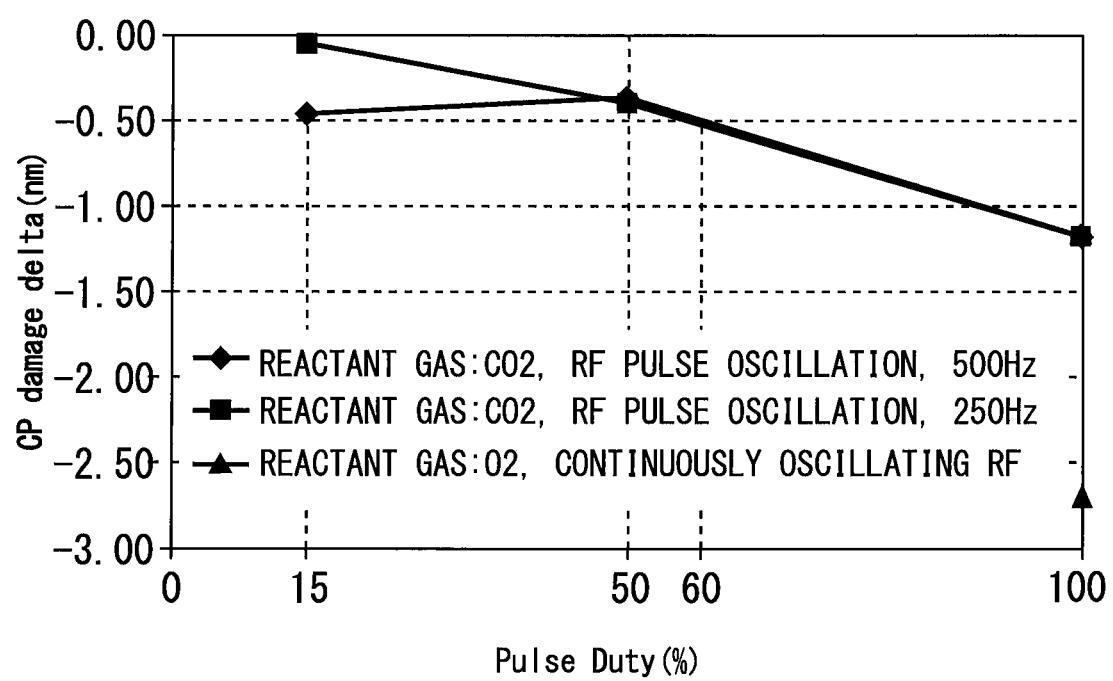
FIG. 4 shows the relationship between the duty cycle of the pulse RF power and the amount of film loss.

FIG. 4 exemplifies the relationship between the duty cycle of the pulse RF power and the amount of film loss of the underlying film of the substrate. FIG. 4 illustrates a case of using $CO_2$ as the reactant gas and using the pulse RF power of 500 Hz, a case of using $CO_2$ as the reactant gas and using the pulse RF power of 250 Hz, and a case of using $O_2$ as the reactant gas and the continuously oscillating RF power. Use of $O_2$ as the reactant gas, and use of the continuously oscillating RF power increase the amount of film loss of the underlying film. Specifically, the underlying film is reduced by 2.5 nm or more. With the continuous oscillation, a strong plasma reaction may heavily damage the underlying film.

On the contrary, use of $CO_2$ as the reactant gas and use of the pulse RF power reduce the amount of film loss. The duty cycle of the pulse RF power and the amount of film loss have a substantially proportional relationship. However, in a domain where the duty cycle is less than 50%, the frequency dependency appears. Specifically, in the domain where the duty cycle is less than 50%, the configuration having the pulse RF power with a frequency equal to or less than 250 Hz can facilitate reduction in the amount of film loss. The reduction in the duty cycle can increase the radical reaction, and reduce the damage to the underlying film.

The invention claimed is:

1. An oxide film forming method comprising:
    providing a precursor to a reaction space including a substrate and a susceptor; and
    forming an oxide film on the substrate by introducing $CO_2$ as a reactant gas into the reaction space while applying a pulse RF power having a duty cycle less than 50% to an RF plate to generate plasma of the reactant gas, the RF plate being provided in the reaction space so as to face the susceptor, wherein
    the providing and the forming are repeated a predetermined number of times, and
    a frequency of the pulse RF power is equal to or less than 250 Hz.

2. The oxide film forming method according to claim 1, wherein
    the duty cycle of the pulse RF power is more than 0% and equal to or less than 15%.

3. The oxide film forming method according to claim 1, wherein
    the precursor includes Si, Ti or Ge, and the oxide film includes SiO, TiO or GeO.

4. The oxide film forming method according to claim 1, comprising:
    purging the precursor without adsorbing to the substrate remaining in the reaction space, after providing the precursor and before generating the plasma; and
    purging the reaction space after forming the oxide film, wherein
    the reaction space is supplied with the reactant gas through the precursor providing, the precursor purging, the oxide film forming, and the reaction space purging.

5. The oxide film forming method according to claim 1, wherein
    when the oxide film is formed, oxygen plasma is generated in addition to the plasma of the reactant gas.

6. The oxide film forming method according to claim 1, wherein
    when the oxide film is formed, plasma of the reactant gas is generated without providing oxygen to the reaction space.

* * * * *